(12) United States Patent
Lin

(10) Patent No.: US 6,215,660 B1
(45) Date of Patent: Apr. 10, 2001

(54) ELECTRONIC APPLIANCE WITH A THERMOELECTRIC HEAT-DISSIPATING APPARATUS

(75) Inventor: Hao-Cheng Lin, No. 281, Hsi-Ning-Nan Rd., Wan-Hua Dist., Taipei (TW)

(73) Assignee: Hao-Cheng Lin, Taipei (TW)

( * ) Notice: Subject to any disclaimer, the term of this patent is extended or adjusted under 35 U.S.C. 154(b) by 0 days.

(21) Appl. No.: 09/556,431

(22) Filed: Apr. 24, 2000

(30) Foreign Application Priority Data

Feb. 22, 2000 (TW) ................................. 89202832

(51) Int. Cl.[7] ...................................... H05K 7/20
(52) U.S. Cl. .................. 361/695; 361/683; 361/687; 361/688; 361/689; 361/690; 361/692; 257/721; 62/3.2; 62/3.7; 62/259.2
(58) Field of Search ......................... 361/683, 687–695, 361/704–707, 715, 717–720, 722; 174/15.2, 16.1, 16.3; 257/712, 713, 721, 723, 223; 136/203, 204; 62/3.2, 3.7, 259.2, 332, 440, 429, 3.62, 457.1, 457.2, 457.9, 404, 419, 428; 165/104.21, 104.33, 80.3

(56) References Cited

U.S. PATENT DOCUMENTS

| | | | |
|---|---|---|---|
| 5,501,076 | * | 3/1996 | Sharp et al. ............................... 62/3.6 |
| 5,890,371 | * | 4/1999 | Rajasubramanian et al. ....... 62/259.2 |
| 5,921,087 | * | 7/1999 | Bhatia et al. ............................ 62/3.2 |
| 5,931,002 | * | 8/1999 | Nagashima ................................ 62/3.7 |
| 5,946,188 | * | 8/1999 | Rochel et al. ........................ 361/690 |
| 5,986,883 | * | 11/1999 | Johnson et al. ...................... 361/695 |
| 6,038,128 | * | 3/2000 | Hood et al. ........................... 361/687 |

FOREIGN PATENT DOCUMENTS

0003421666A2 * 11/1989 (EP) ................................ B60H/1/32

* cited by examiner

Primary Examiner—Leo P. Picard
Assistant Examiner—Michael Datskovsky
(74) Attorney, Agent, or Firm—Pillsbury Winthrop LLP

(57) ABSTRACT

An electronic appliance includes a heat-dissipating apparatus mounted in a housing that has a heat-producing electronic component disposed therein. The heat-dissipating apparatus includes a thermoelectric semiconductor module operable so as to provide low and high temperature surfaces, a cool air blower unit including a first fan casing in heat-conductive contact with the low temperature surface, and a hot air exhaust unit including a second fan casing in heat-conductive contact with the high temperature surface. The cool air blower unit further includes a first fan mounted in the first fan casing and operable so as to draw air into the first fan casing via a first air inlet and so as to blow the air out of the first fan casing via a first air outlet. The air passing from the first air inlet to the first air outlet is cooled when the thermoelectric semiconductor module is operated due to contact between the first fan casing and the low temperature surface. The hot air exhaust unit further includes a second fan mounted in the second fan casing and operable so as to draw air into the second fan casing via a second air inlet and so as to blow the air out of the second fan casing and the housing via a second air outlet of the second fan casing and a main air outlet of the housing.

20 Claims, 7 Drawing Sheets

ELECTRONIC APPLIANCE WITH A THERMOELECTRIC HEAT-DISSIPATING APPARATUS

BACKGROUND OF THE INVENTION

1. Field of the Invention

The invention relates to a heat-dissipating apparatus for an electronic appliance, more particularly to an electronic appliance with a thermoelectric heat-dissipating apparatus.

2. Description of the Related Art

FIG. 1 illustrates a conventional heat-dissipating device 2 for dissipating heat generated by an electronic component, such as a CPU, inside a computer housing 1. The computer housing 1 is formed with a device port 11. The conventional heat-dissipating device 2 is mounted in the device port 11, and includes a frame unit and a fan unit. The frame unit includes a mounting plate 21 mounted in the device port 11 and having three mounting holes 22, and two engaging plates 23 extending from opposite ends of the mounting plate 21 and into the computer housing 1 for engaging the latter. The fan unit includes three fans 24 mounted in the mounting holes 22. The conventional heat-dissipating device 2 further includes a grille frame 25 connected to the mounting plate 21, and a filter member 22 disposed between the grille frame 25 and the mounting plate 21. The fan unit is operable so as to draw air to the exterior of the computer housing 1.

A main drawback of the conventional heat-dissipating device 2 resides that the limited heat dissipating effect provided thereby is affected by the room temperature. During summer, the conventional heat-dissipating device 2 cannot provide adequate heat-dissipation for the electronic component, thereby resulting in a shorter service life and lower operating efficiency for the electronic component.

SUMMARY OF THE INVENTION

Therefore, the main object of the present invention is to provide an electronic appliance with a thermoelectric heat-dissipating apparatus to result in an improved heat-dissipation effect.

According to one aspect of the present invention, an electronic appliance includes a housing, and a heat-dissipating apparatus mounted in the housing.

The housing has a heat-producing electronic component disposed therein, and is formed with a main air outlet.

The heat-dissipating apparatus includes a thermoelectric semiconductor module, a cool air blower unit and a hot air exhaust unit. The thermoelectric semiconductor module is formed as a plate body, and is operable so as to provide a low temperature surface and a high temperature surface opposite to the low temperature surface. The cool air blower unit includes a first fan casing made of a heat conductive material and in heat-conductive contact with the low temperature surface of the thermoelectric semiconductor module. The first fan housing has a first air inlet and a first air outlet. The cool air blower unit further includes a first fan mounted in the first fan casing and operable so as to draw air into the first fan casing via the first air inlet and so as to blow the air out of the first fan casing via the first air outlet. The air passing from the first air inlet to the first air outlet is cooled when the thermoelectric semiconductor module is operated due to contact between the first fan casing and the low temperature surface of the thermoelectric semiconductor module. The hot air exhaust unit includes a second fan casing made of a heat conductive material and in heat-conductive contact with the high temperature surface of the thermoelectric semiconductor module. The second fan casing has a second air inlet and a second air outlet disposed adjacent to the main air outlet of the housing. The hot air exhaust unit further includes a second fan mounted in the second fan casing and operable so as to draw air into the second fan casing via the second air inlet and so as to blow the air out of the second fan casing and the housing via the second air outlet and the main air outlet.

According to another aspect of the present invention, a heat-dissipating apparatus is adapted to be mounted in a housing of an electronic appliance. The housing has a heat-producing electronic component disposed therein, and is formed with a main air outlet. The heat-dissipating apparatus includes a thermoelectric semiconductor module, a cool air blower unit and a hot air exhaust unit.

The thermoelectric semiconductor module is formed as a plate body, and is operable so as to provide a low temperature surface extending along a horizontal plane, and a high temperature surface opposite and parallel to and disposed above the low temperature surface.

The cool air blower unit includes a first fan casing made of a heat conductive material. The first fan casing has a first wall in heat-conductive contact with the low temperature surface of the thermoelectric semiconductor module, a second wall formed with a first air inlet, and a third wall transverse to the first and second walls and formed with a first air outlet. The cool air blower unit further includes a first fan mounted in the first fan casing and operable so as to draw air into the first fan casing via the first air inlet and so as to blow the air out of the first fan casing via the first air outlet. The air passing from the first air inlet to the first air outlet is cooled when the thermoelectric semiconductor module is operated due to contact between the first fan casing and the low temperature surface of the thermoelectric semiconductor module.

The hot air exhaust unit includes a second fan casing made of a heat conductive material. The second fan casing has a first casing wall in heat-conductive contact with the high temperature surface of the thermoelectric semiconductor module, a second casing wall formed with a second air inlet, and a third casing wall transverse to the first and second casing walls and formed with a second air outlet. The second air outlet is adapted to be disposed adjacent to the main air outlet of the housing. The hot air exhaust unit further includes a second fan mounted in the second fan casing and operable so as to draw air into the second fan casing via the second air inlet and so as to blow the air out of the second fan casing via the second air outlet. The air passing through the second air outlet can flow out of the housing via the main air outlet.

According to a further aspect of the present invention, a heat-dissipating apparatus is adapted to be mounted in a housing of an electronic appliance. The housing has a heat-producing electronic component disposed therein, and is formed with a main air outlet. The heat-dissipating apparatus includes a heat-conductive support plate extending along a horizontal plane, a thermoelectric semiconductor module, a cool air blower unit, and a hot air exhaust unit.

The thermoelectric semiconductor module is formed as a plate body, and is operable so as to provide a low temperature surface and a high temperature surface opposite and parallel to and disposed below the low temperature surface. The thermoelectric semiconductor module is mounted on the support plate such that the high temperature surface is in heat-conductive contact therewith.

The cool air blower unit includes a first fan casing made of a heat conductive material and having a first air inlet and a first air outlet. The first fan casing is mounted on the support plate, and is in heat-conductive contact with the low temperature surface of the thermoelectric semiconductor module. The cool air blower unit further includes a first fan mounted in the first fan casing and operable so as to draw air into the first fan casing via the first air inlet and so as to blow the air out of the first fan casing via the first air outlet. The air passing from the first air inlet to the first air outlet is cooled when the thermoelectric semiconductor module is operated due to contact between the first fan casing and the low temperature surface of the thermoelectric semiconductor module.

The hot air exhaust unit includes a second fan casing made of a heat-conductive material and mounted on the support plate adjacent to the thermoelectric semiconductor module. The second fan casing is formed with a second air inlet and a second air outlet. The second air outlet is adapted to be disposed adjacent the main air outlet of the housing. The hot air exhaust unit further includes a second fan mounted in the second fan housing and operable so as to draw air into the second fan casing via the second air inlet and so as to blow the air out of the second fan casing via the second air outlet. The air passing through the second air outlet can flow out of the housing via the main air outlet.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
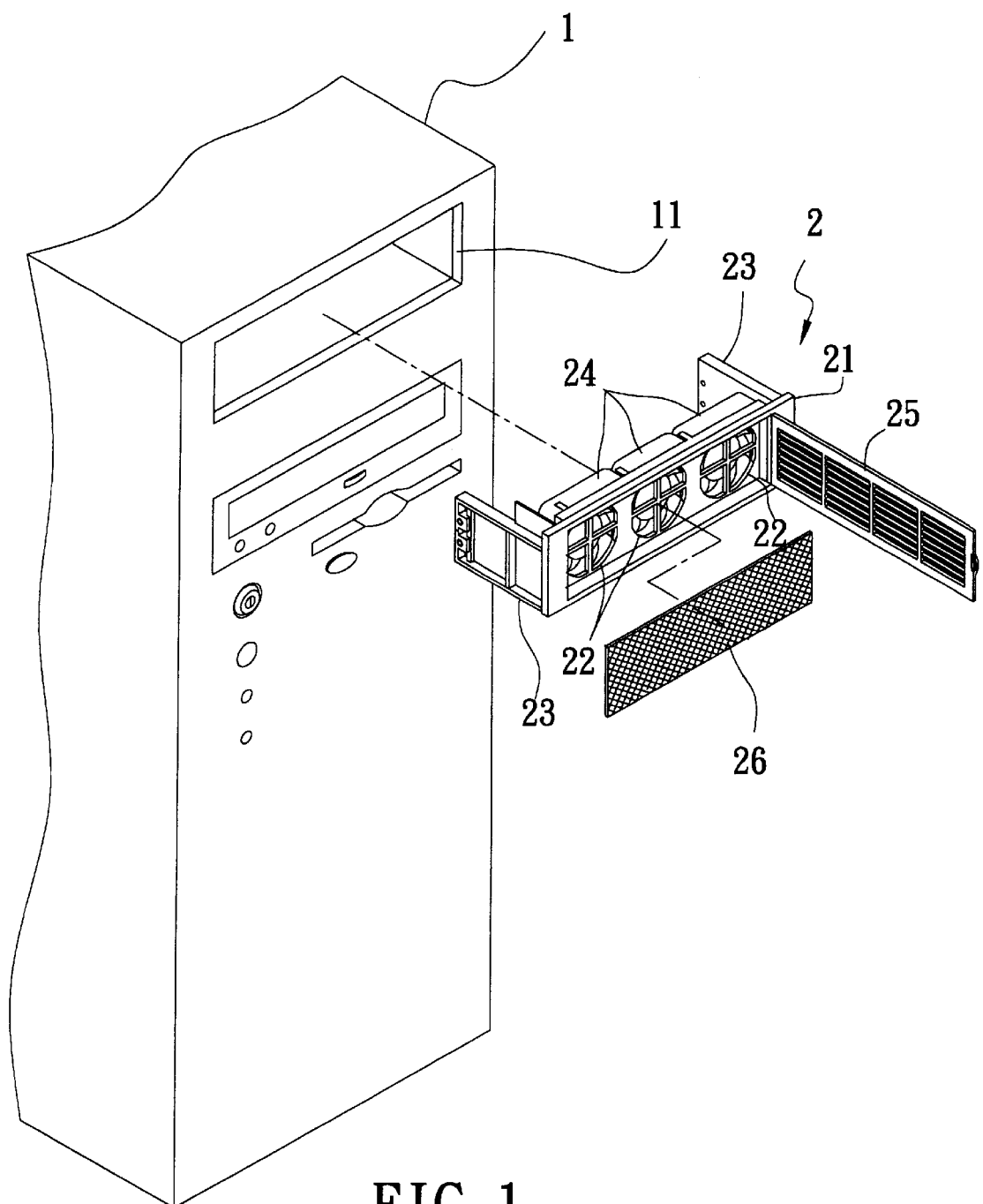
FIG. 1 is an exploded fragmentary perspective view of a conventional heat-dissipating apparatus installed on a computer housing.
Figure 2:
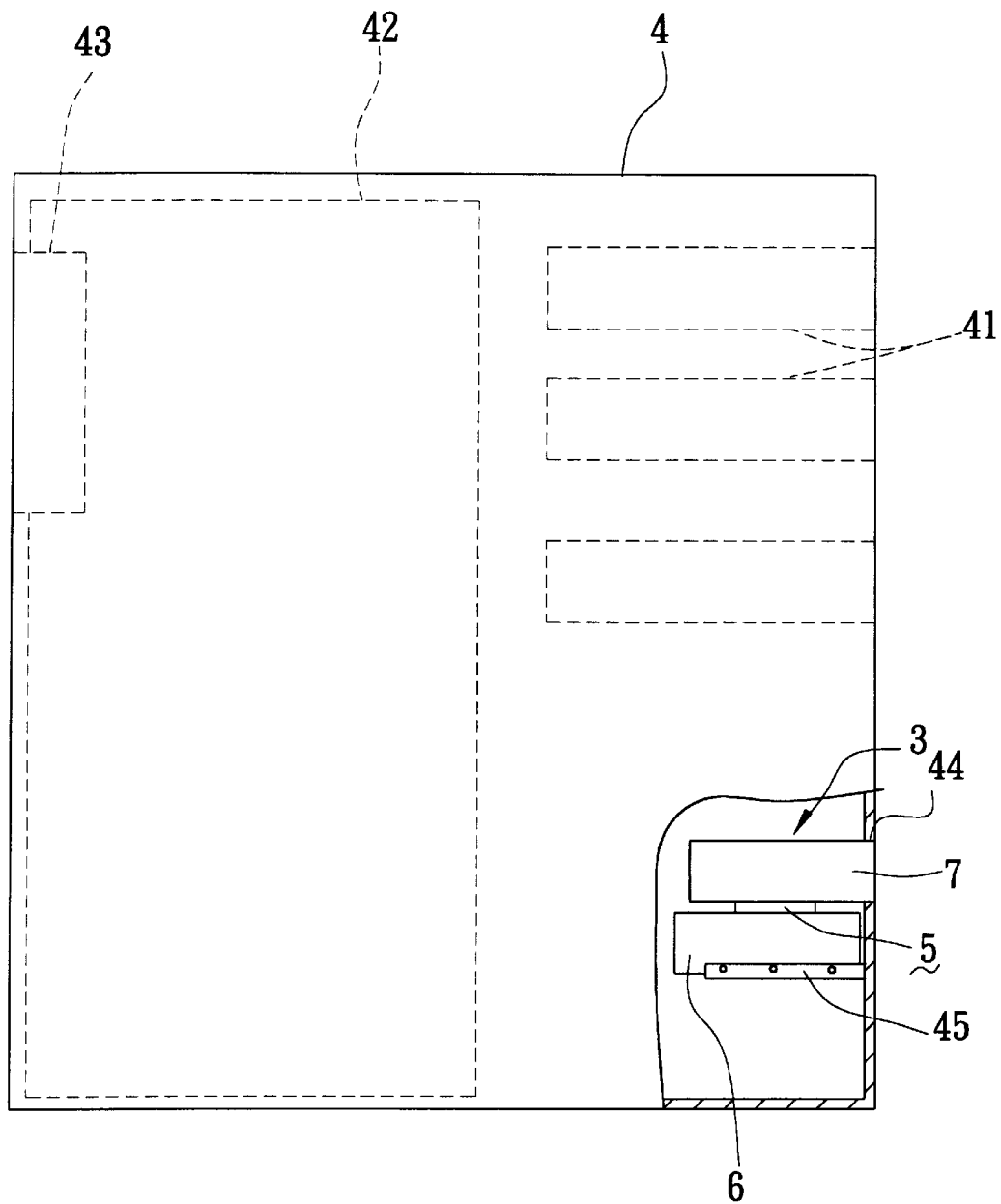
FIG. 2 is a partly cutaway schematic side view of the first preferred embodiment of a computer with a thermoelectric heat-dissipating apparatus according to this invention.

Referring to FIG. 2, according to the first preferred embodiment of this invention, an electronic appliance in the form of a computer is shown to include a housing 4, and a heat-dissipating apparatus 3 mounted in the housing 4 on a support frame 45.

The housing 4 has a plurality of disk drives 41 disposed therein adjacent to a front side thereof, an electronic component region 42 disposed between the disk drives 41 and a rear side thereof, and an exhaust fan 43 mounted therein adjacent to the rear side. The electronic component region 42 is provided with a heat-producing electronic component (not shown), such as a CPU. The housing 4 is formed with a main air outlet 44 on the front side.

Figure 3:
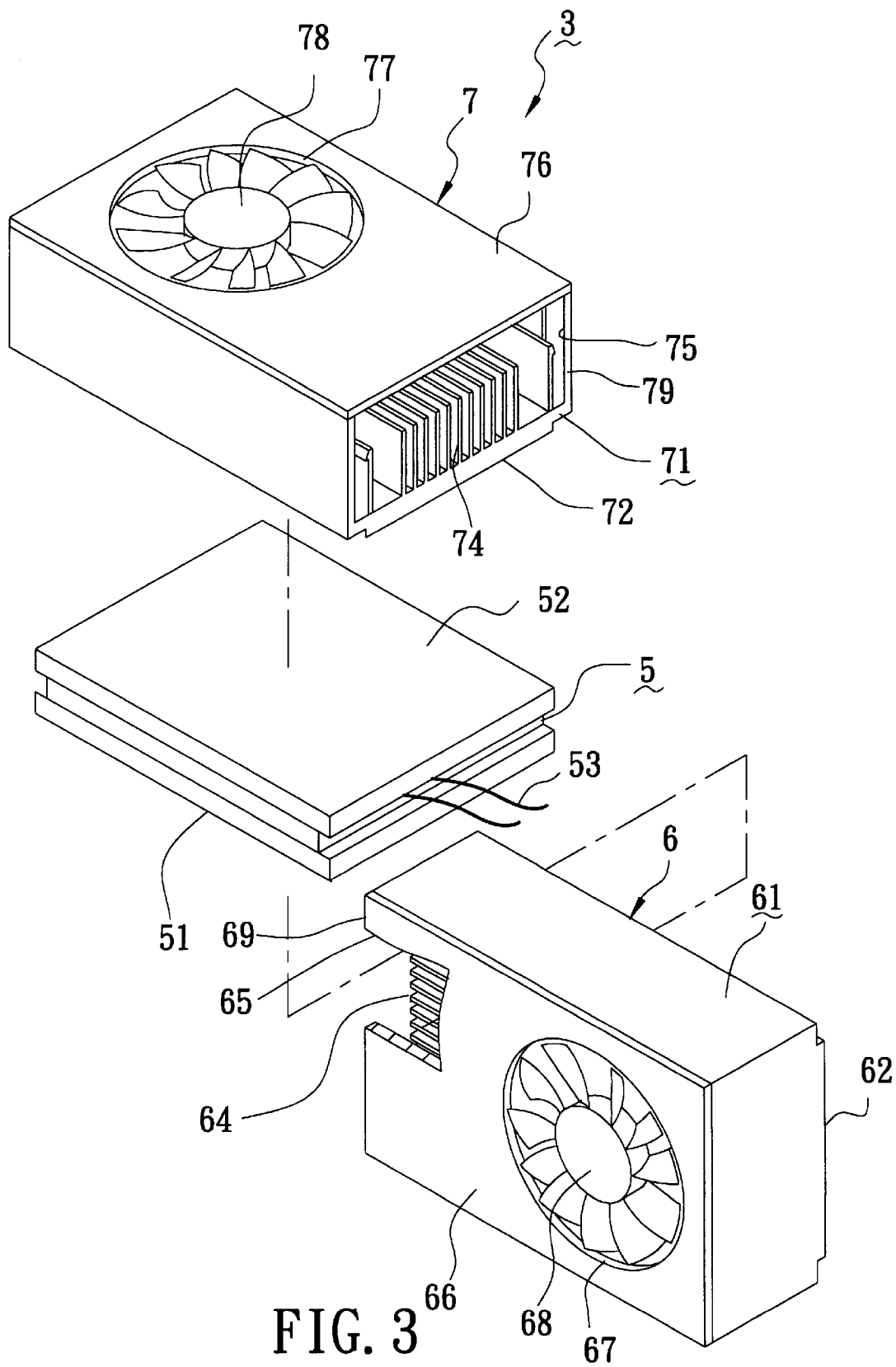
FIG. 3 is an exploded perspective view of the thermoelectric heat-dissipating apparatus of the first preferred embodiment.

Referring to FIG. 3, the heat-dissipating apparatus 3 includes a thermoelectric semiconductor module 5, a cool air blower unit 6 and a hot air exhaust unit 7.

The thermoelectric semiconductor module 5, such as one available from DESTECH Solutions Inc., a Taiwanese company, is formed as a plate body, and is operable when dc power is supplied thereto via wires 53 so as to provide a low temperature surface 51 extending along a horizontal plane, and a high temperature surface 52 opposite and parallel to and disposed above the low temperature surface 51.

The cool air blower unit 6 includes a first fan casing 61 made of a heat conductive material, such as aluminum, copper and magnesium. The first fan casing 61 has a first wall 62 connected directly to and in heat-conductive contact with the low temperature surface 51 of the thermoelectric semiconductor module 5, a second wall 66 formed with a first air inlet 67, and a third wall 69 transverse to the first and second walls 62, 66 and formed with a first air outlet 65. The first fan casing 61 is formed with a plurality of heat-dissipating fins 64 adjacent to the first air outlet 65. The cool air blower unit 6 further includes a first fan 68 mounted in the first fan casing 61 and operable so as to draw air into the first fan casing 61 via the first air inlet 67 and so as to blow the air out of the first fan casing 61 via the first air outlet 65. The air passing from the first air inlet 68 to the first air outlet 65 is cooled when the thermoelectric semiconductor module 5 is operated due to contact between the first wall 62 of the first fan casing 61 and the low temperature surface 51 of the thermoelectric semiconductor module 5.

The hot air exhaust unit 7 includes a second fan casing 71 made of a heat conductive material, similar to that of the first fan casing 61. The second fan casing 71 has a first casing wall 72 connected directly to and in heat-conductive contact with the high temperature surface 52 of the thermoelectric semiconductor module 5, a second casing wall 76 formed with a second air inlet 77, and a third casing wall 79 transverse to the first and second casing walls 72, 76 and formed with a second air outlet 75. The second air outlet 75 is disposed adjacent to the main air outlet 44 of the housing 4, as shown in FIG. 2. The second fan casing 71 is formed with a plurality of heat-dissipating fins 74 adjacent to the second air outlet 75. The hot air exhaust unit 7 further includes a second fan 78 mounted in the second fan casing 71 and operable so as to draw air into the second fan casing 71 via the second air inlet 77 and so as to blow the air out of the second fan casing 71 via the second air outlet 75. As such, the air passing through the second air outlet 75 can flow out of the housing 4 via the main air outlet 44, thereby preventing the heat generated at the high temperature surface 52 of the thermoelectric semiconductor module 5 from affecting the operation of the components on the electronic component region 42 inside the housing 4.

Figure 4:
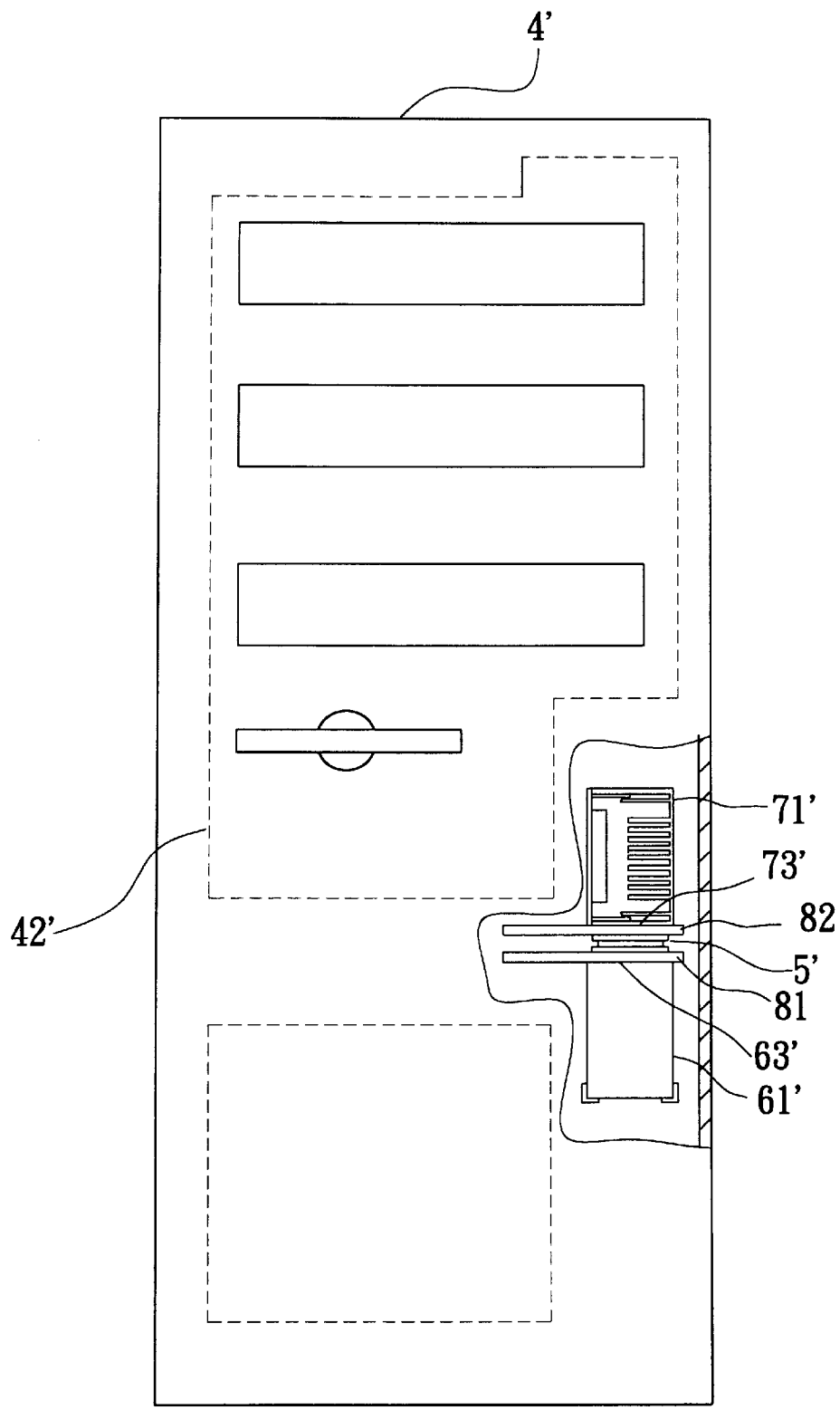
FIG. 4 is a partly cutaway schematic front view of the second preferred embodiment of a computer with a thermoelectric heat-dissipating apparatus according to this invention.
Figure 5:
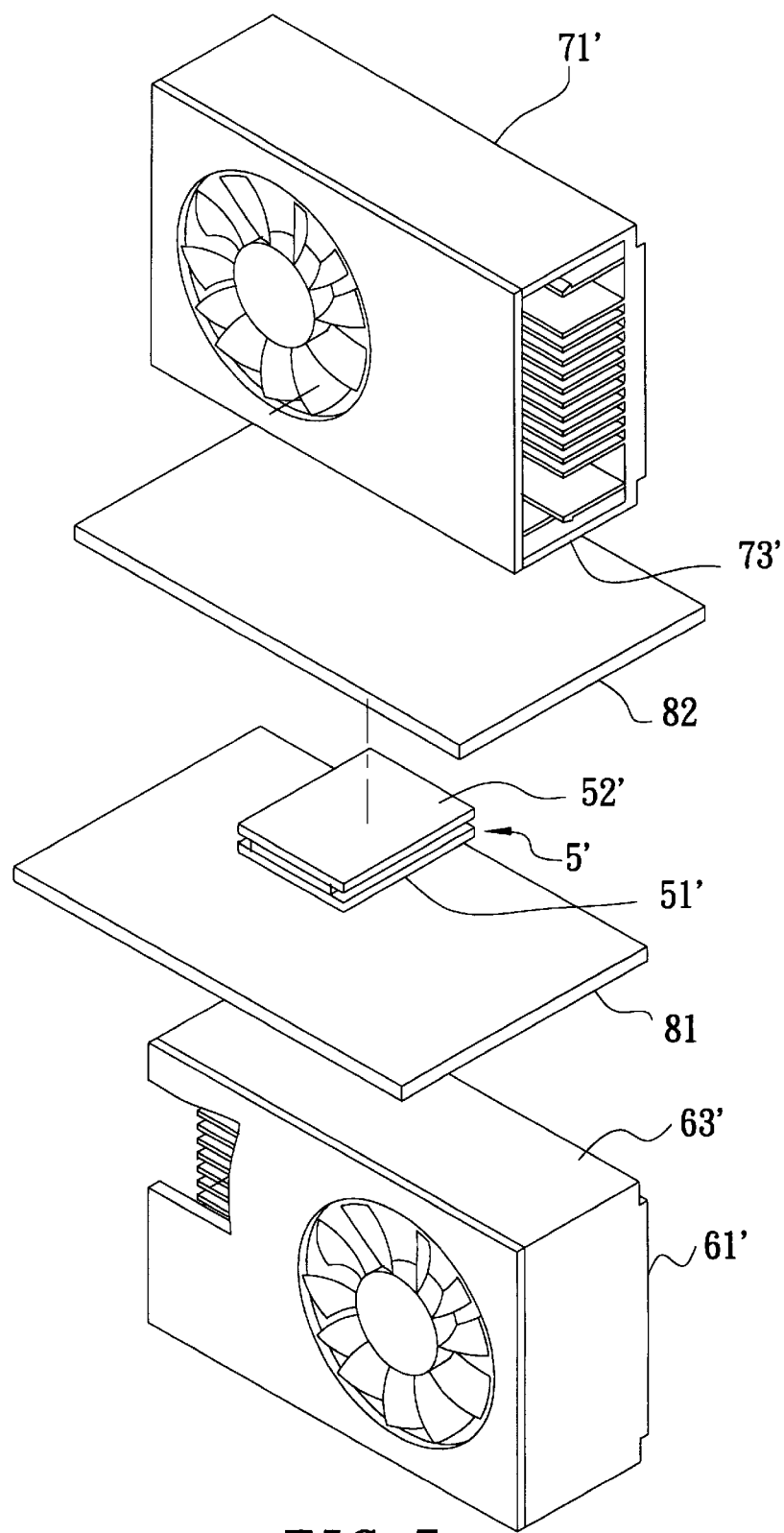
FIG. 5 is an exploded perspective view of the thermoelectric heat-dissipating apparatus of the second preferred embodiment.

FIGS. 4 and 5 illustrate a computer embodying the second preferred embodiment of this invention, which is a modification of the first preferred embodiment. Unlike the previous embodiment, in case there is limited space in the housing 4' of the computer, a first heat-conductive plate 81 may be disposed between the first wall 63' of the first fan casing 61' and the low temperature surface 51' of the thermoelectric semiconductor module 5', and a second heat-conductive plate 82 may be disposed between the first casing wall 73' of the second fan casing 71' and the high temperature surface 52' of the thermoelectric semiconductor module 5'. Although the height of the heat-dissipating apparatus is increased in this embodiment, the width thereof is reduced.

Figure 6:
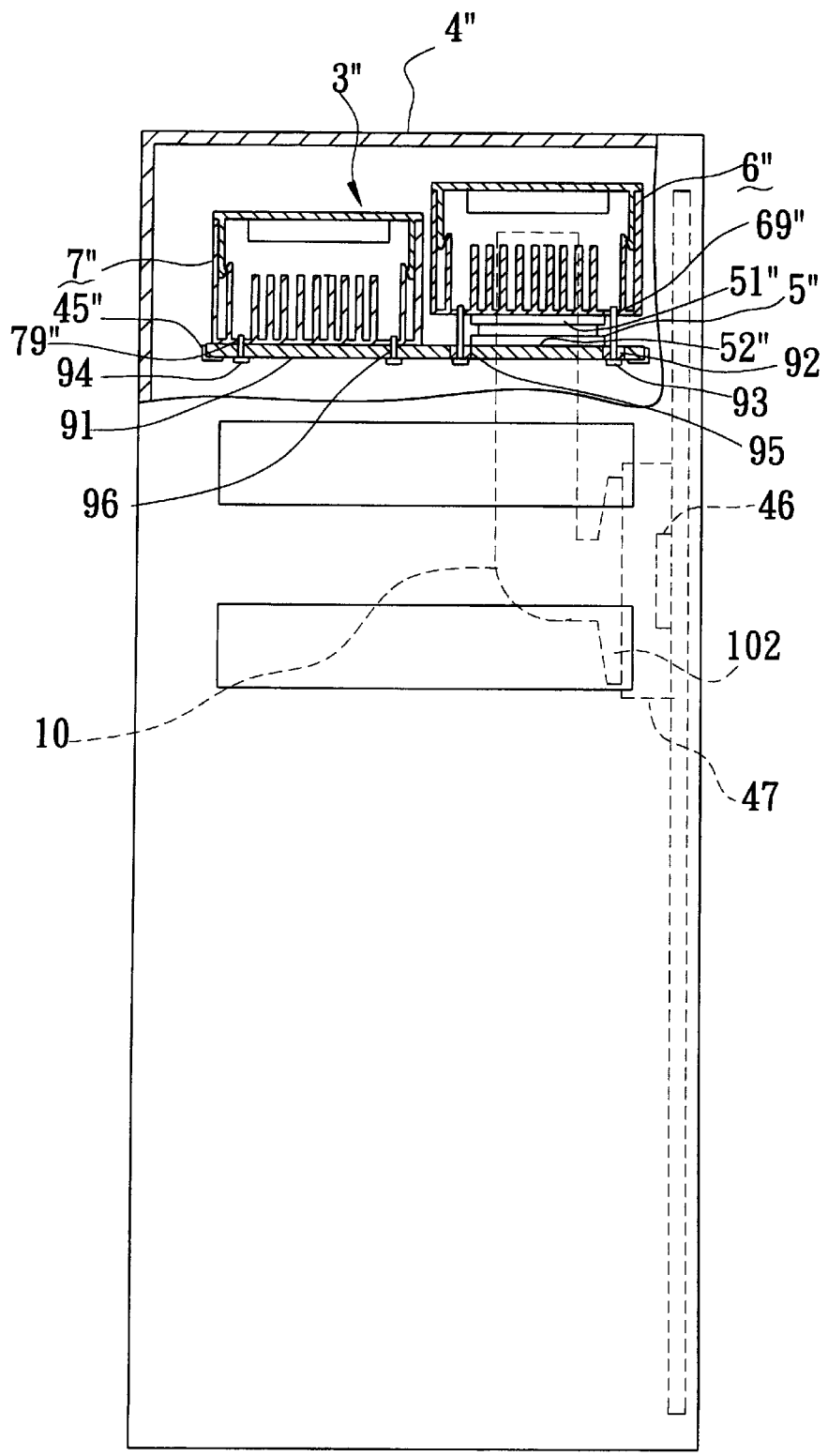
FIG. 6 is a partly cutaway schematic front view of the third preferred embodiment of a computer with a thermoelectric heat-dissipating apparatus according to this invention.
Figure 7:
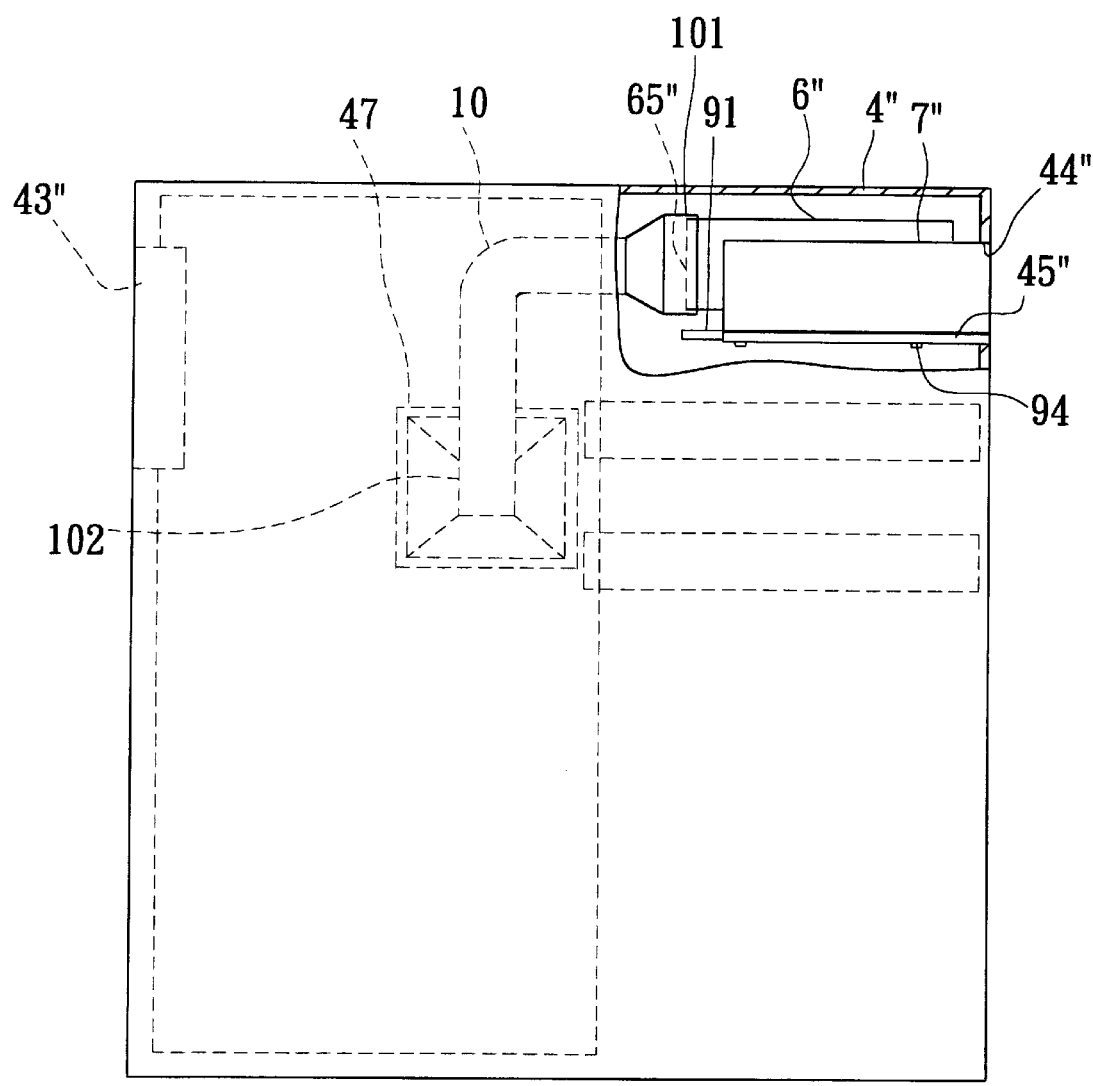
FIG. 7 is a partly cutaway schematic side view of the third preferred embodiment.

FIGS. 6 and 7 illustrate a computer embodying the third preferred embodiment of this invention. The computer includes a housing 4" having a CPU 46 disposed therein, and a heat-dissipating apparatus 3" mounted in the housing 4". The housing 4" is formed with a main air outlet 44", and is provided with an exhaust fan 43".

The heat-dissipating apparatus 3" includes a heat-conductive support plate 91, a thermoelectric semiconductor module 5", a cool air blower unit 6" and a hot air exhaust unit 7".

The support plate 91, which is made of copper, extends along a horizontal plane, and is fastened on a support frame 45" in the housing 4". The support plate 91 is formed with a plurality of first fastener holes 95 and a plurality of second fastener holes 96.

The thermoelectric semiconductor module 5", which is similar to those of the previous embodiments, is formed as a plate body, and is operable so as to provide a low temperature surface 51" and a high temperature surface 52" opposite and parallel to and disposed below the low temperature surface 51". The thermoelectric semiconductor module 5" is mounted on the support plate 91 such that the high temperature surface 52" is in heat-conductive contact therewith.

The cool air blower unit 6" has a construction similar to those of the previous embodiments. The first fan casing of the cool air blower unit 6" is mounted on the support plate 91 and is in heat-conductive contact with the low temperature surface 51". A plurality of first screw fasteners 93 extend through the first fastener holes 95 and engage a plurality of screw holes 69" in the first wall of the first fan casing to mount the first fan casing on the support plate 91. A plurality of heat insulation washers 92 are disposed respectively in the first fastener holes 95 to provide heat insulation between the support plate 91 and the first screw fasteners 93.

The hot air exhaust unit 7" has a construction similar to those of the previous embodiments. The second fan casing of the hot air exhaust unit 7" is mounted on the support plate 91 adjacent to the temperature semiconductor module 5". A plurality of second screw fasteners 94 extend through the second fastener holes 96 and engage a plurality of screw holes 79" in the first casing wall of the second fan casing to mount the second fan casing on the support plate 91 adjacent to the thermoelectric semiconductor module 5".

In this embodiment, the heat-dissipating apparatus 3" further includes a guide pipe 10 having a first end 101 connected to the first air outlet 65", and a second end 102 directed toward the CPU 46 in the housing 4" and connected to a fan unit 47 on the CPU 46 so as to further improve the heat-dissipating effect. An experimental result is provided as follows: at a room temperature of 23° C., the temperature of the air exhausted out of the housing 4" is about 46.2° C. without the use of the heat-dissipating apparatus 3" of this invention. The temperature of the air exhausted by the exhaust fan 43" is about 39° C. when the heat-dissipating apparatus 3" of this invention is in use. The object of the invention is thus met.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. An electronic appliance comprising:
    a housing having a heat-producing electronic component disposed therein, said housing being formed with a main air outlet; and
    a heat-dissipating apparatus mounted in said housing and including
    a thermoelectric semiconductor module formed as a plate body and operable so as to provide a low temperature surface and a high temperature surface opposite to said low temperature surface,
    a cool air blower unit including a first fan casing made of a heat conductive material and in heat-conductive contact with said low temperature surface of said thermoelectric semiconductor module, said first fan casing having a first air inlet and a first air outlet, said cool air blower unit further including a first fan mounted in said first fan casing and operable so as to draw air into said first fan casing via said first air inlet and so as to blow the air out of said first fan casing via said first air outlet, wherein the air passing from said first air inlet to said first air outlet is cooled when said thermoelectric semiconductor module is operated due to contact between said first fan casing and said low temperature surface of said thermoelectric semiconductor module, and
    a hot air exhaust unit including a second fan casing made of a heat conductive material and in heat-conductive contact with said high temperature surface of said thermoelectric semiconductor module, said second fan casing having a second air inlet and a second air outlet disposed adjacent to said main air outlet of said housing, said hot air exhaust unit further including a second fan mounted in said second fan casing and operable so as to draw air into said second fan casing via said second air inlet and so as to blow the air out of said second fan casing and said housing via said second air outlet and said main air outlet.

2. The electronic appliance of claim 1, wherein:
    said first fan casing has a first wall in heat-conductive contact with said low temperature surface of said thermoelectric semiconductor module, a second wall formed with said first air inlet, and a third wall transverse to said first and second walls and formed with said first air outlet, and
    said second fan casing has a first casing wall in heat-conductive contact with said high temperature surface of said thermoelectric semiconductor module, a second casing wall formed with said second air inlet, and a third casing wall transverse to said first and second casing walls and formed with said second air outlet.

3. The electronic appliance of claim 1, wherein said first fan casing is formed with a plurality of heat-dissipating fins adjacent to said first air outlet.

4. The electronic appliance of claim 1, wherein said second fan casing is formed with a plurality of heat-dissipating fins adjacent to said second air outlet.

5. The electronic appliance of claim 2, wherein said first wall of said first fan casing is connected directly to said low temperature surface of said thermoelectric semiconductor module, and said first casing wall of said second fan casing is connected directly to said high temperature surface of said thermoelectric semiconductor module.

6. The electronic appliance of claim 1, further comprising a first heat-conductive plate disposed between said first fan casing and said low temperature surface of said thermoelectric semiconductor module, and a second heat-conductive plate disposed between said second fan casing and said high temperature surface of said thermoelectric semiconductor module.

7. The electronic appliance of claim 1, wherein said heat-dissipating apparatus further includes a heat-conductive support plate, said thermoelectric semiconductor module and said second fan casing being mounted on said support plate such that heat-conductive contact between said high temperature surface of said thermoelectric semiconductor module and said second fan casing is established via said support plate.

8. The electronic appliance of claim 7, wherein said thermoelectric semiconductor module is disposed between said first fan casing and said support plate, said heat-dissipating apparatus further including fastener means for fastening said first fan casing to said support plate, and heat insulation means for providing heat insulation between said support plate and said fastener means.

9. The electronic appliance of claim 1, wherein said heat-dissipating apparatus further includes:
  a heat-conductive support plate having said thermoelectric semiconductor module mounted thereon and in heat-conductive contact with said high temperature surface of said thermoelectric semiconductor module, said support plate being formed with a plurality of first fastener holes and a plurality of second fastener holes;
  a plurality of first screw fasteners extending through said first fastener holes and engaging threadedly said first fan casing such that said thermoelectric semiconductor module is disposed between said first fan casing and said support plate;
  a plurality of heat insulation washers disposed respectively in said first fastener holes to provide heat insulation between said support plate and said first screw fasteners; and
  a plurality of second screw fasteners extending through said second fastener holes and engaging threadedly said second fan casing to mount said second fan casing on said support plate adjacent to said thermoelectric semiconductor module.

10. The electronic appliance of claim 1, wherein said heat-dissipating apparatus further includes a guide pipe having a first end connected to said first air outlet, and a second end directed toward said electronic component.

11. A heat-dissipating apparatus adapted to be mounted in a housing of an electronic appliance, the housing having a heat-producing electronic component disposed therein and being formed with a main air outlet, said heat-dissipating apparatus comprising:
  a thermoelectric semiconductor module formed as a plate body and operable so as to provide a low temperature surface extending along a horizontal plane, and a high temperature surface opposite and parallel to and disposed above said low temperature surface;
  a cool air blower unit including a first fan casing made of a heat conductive material, said first fan casing having a first wall in heat-conductive contact with said low temperature surface of said thermoelectric semiconductor module, a second wall formed with a first air inlet, and a third wall transverse to said first and second walls and formed with a first air outlet, said cool air blower unit further including a first fan mounted in said first fan casing and operable so as to draw air into said first fan casing via said first air inlet and so as to blow the air out of said first fan casing via said first air outlet, wherein the air passing from said first air inlet to said first air outlet is cooled when said thermoelectric semiconductor module is operated due to contact between said first fan casing and said low temperature surface of said thermoelectric semiconductor module; and
  a hot air exhaust unit including a second fan casing made of a heat conductive material, said second fan casing having a first casing wall in heat-conductive contact with said high temperature surface of said thermoelectric semiconductor module, a second casing wall formed with a second air inlet, and a third casing wall transverse to said first and second casing walls and formed with a second air outlet, said second air outlet being adapted to be disposed adjacent to the main air outlet of the housing, said hot air exhaust unit further including a second fan mounted in said second fan casing and operable so as to draw air into said second fan casing via said second air inlet and so as to blow the air out of said second fan casing via said second air outlet, whereby the air passing through said second air outlet can flow out of the housing via the main air outlet.

12. The heat-dissipating apparatus of claim 11, wherein said first fan casing is formed with a plurality of heat-dissipating fins adjacent to said first air outlet.

13. The heat-dissipating apparatus of claim 11, wherein said second fan casing is formed with a plurality of heat-dissipating fins adjacent to said second air outlet.

14. The heat-dissipating apparatus of claim 11, wherein said first wall of said first fan casing is connected directly to said low temperature surface of said thermoelectric semiconductor module, and said first casing wall of said second fan casing is connected directly to said high temperature surface of said thermoelectric semiconductor module.

15. A heat-dissipating apparatus adapted to be mounted in a housing of an electronic appliance, the housing having a heat-producing electronic component disposed therein and being formed with a main air outlet, said heat-dissipating apparatus comprising:
  a heat-conductive support plate extending along a horizontal plane;
  a thermoelectric semiconductor module formed as a plate body and operable so as to provide a low temperature surface and a high temperature surface opposite and parallel to and disposed below said low temperature surface, said thermoelectric semiconductor module being mounted on said support plate such that said high temperature surface is in heat-conductive contact therewith;
  a cool air blower unit including a first fan casing made of a heat conductive material and having a first air inlet and a first air outlet, said first fan casing being mounted on said support plate and being in heat-conductive contact with said low temperature surface of said thermoelectric semiconductor module, said cool air blower unit further including a first fan mounted in said first fan casing and operable so as to draw air into said first fan casing via said first air inlet and so as to blow the air out of said first fan casing via said first air outlet, wherein the air passing from said first air inlet to said first air outlet is cooled when said thermoelectric semiconductor module is operated due to contact between said first fan casing and said low temperature surface of said thermoelectric semiconductor module; and
  a hot air exhaust unit including a second fan casing made of a heat-conductive material and mounted on said support plate adjacent to said thermoelectric semiconductor module, said second fan casing being formed with a second air inlet and a second air outlet, said second air outlet being adapted to be disposed adjacent to the main air outlet of the housing, said hot air exhaust unit further including a second fan mounted in said second fan casing and operable so as to draw air into said second fan casing via said second air inlet and so as to blow the air out of said second fan casing via said second air outlet, whereby the air passing through said second air outlet can flow out of the housing via the main air outlet.

16. The heat-dissipating apparatus of claim 15, wherein:

said first fan casing has a first wall in heat-conductive contact with said low temperature surface of said thermoelectric semiconductor module, a second wall formed with said first air inlet, and a third wall transverse to said first and second walls and formed with said first air outlet, and said second fan casing has a first casing wall in heat-conductive contact with said support plate, a second casing wall formed with said second air inlet, and a third casing wall transverse to said first and second casing walls and formed with said second air outlet.

17. The heat-dissipating apparatus of claim 15, wherein said support plate is formed with a plurality of first fastener holes and a plurality of second fastener holes, said heat-dissipating apparatus further comprising:

a plurality of first screw fasteners extending through said first fastener holes and engaging threadedly said first fan casing to mount said first fan casing on said support plate;

a plurality of heat insulation washers disposed respectively in said first fastener holes to provide heat insulation between said support plate and said first screw fasteners; and a plurality of second screw fasteners extending through said second fastener holes and engaging threadedly said second fan casing to mount said second fan casing on said support plate adjacent to said thermoelectric semiconductor module.

18. The heat-dissipating apparatus of claim 15, further comprising a guide pipe having a first end connected to said first air outlet, and a second end adapted to be directed toward the electronic component in the housing of the electronic appliance.

19. The heat-dissipating apparatus of claim 15, wherein said first fan casing is formed with a plurality of heat-dissipating fins adjacent to said first air outlet.

20. The heat-dissipating apparatus of claim 15, wherein said second fan casing is formed with a plurality of heat-dissipating fins adjacent to said second air outlet.

* * * * *